(12) United States Patent
Xu et al.

(10) Patent No.: US 10,374,089 B2
(45) Date of Patent: Aug. 6, 2019

(54) TENSILE STRAIN IN NFET CHANNEL

(71) Applicant: International Business Machines Corporation, Armonk, NY (US)

(72) Inventors: Peng Xu, Santa Clara, CA (US); Kangguo Cheng, Schenectady, NY (US); Juntao Li, Cohoes, NY (US); Heng Wu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/852,109

(22) Filed: Dec. 22, 2017

(65) Prior Publication Data

US 2019/0198671 A1 Jun. 27, 2019

(51) Int. Cl.

| | |
|---|---|
| *H01L 21/8238* | (2006.01) |
| *H01L 29/78* | (2006.01) |
| *H01L 29/66* | (2006.01) |
| *H01L 21/02* | (2006.01) |
| *H01L 29/165* | (2006.01) |
| *H01L 21/311* | (2006.01) |
| *H01L 29/08* | (2006.01) |
| *H01L 21/3105* | (2006.01) |
| *H01L 29/10* | (2006.01) |
| *H01L 29/06* | (2006.01) |

(52) U.S. Cl.
CPC ...... *H01L 29/7849* (2013.01); *H01L 21/0214* (2013.01); *H01L 21/0217* (2013.01); *H01L 21/02236* (2013.01); *H01L 21/02532* (2013.01); *H01L 21/31053* (2013.01); *H01L 21/31111* (2013.01); *H01L 29/0649* (2013.01); *H01L 29/0847* (2013.01); *H01L 29/1033* (2013.01); *H01L 29/165* (2013.01); *H01L 29/6656* (2013.01); *H01L 29/66545* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 6,717,216 B1 | 4/2004 | Doris et al. | |
| 7,705,345 B2 | 4/2010 | Bedell et al. | |
| 9,263,528 B2 | 2/2016 | Vincent | |
| 9,293,583 B2 | 3/2016 | Cheng et al. | |
| 9,306,066 B2 | 4/2016 | Xu et al. | |

(Continued)

*Primary Examiner* — Long Pham
(74) *Attorney, Agent, or Firm* — Vazken Alexanian; Ryan, Mason & Lewis, LLP

(57) ABSTRACT

A method of forming a semiconductor structure includes forming a fin in a film stack disposed over a top surface of a substrate, the film stack comprising a first semiconductor layer, a second semiconductor layer and a channel layer. The method also includes forming an oxide layer disposed over the top surface of the substrate surrounding the fin, the oxide layer covering sidewalls of the first semiconductor layer and the second semiconductor layer, performing a channel release to remove the second semiconductor layer, and performing an oxidation to form a non-uniform thickness of an additional oxide layer along a length of the fin, the non-uniform thickness providing a vertical compressive strain that induces lateral tensile strain in the channel layer. The channel layer comprises an n-type field-effect transistor (NFET) channel.

18 Claims, 10 Drawing Sheets

(56) References Cited

U.S. PATENT DOCUMENTS

| | | |
|---|---|---|
| 9,484,272 B2 | 11/2016 | Cappellani et al. |
| 9,761,498 B2 | 9/2017 | Doris et al. |
| 2016/0218042 A1 | 7/2016 | Ching et al. |
| 2017/0154900 A1 | 6/2017 | Liu et al. |
| 2017/0247251 A1* | 8/2017 | Chu .................... B81C 1/00309 |
| 2018/0076097 A1* | 3/2018 | Ching ................. H01L 29/1054 |

* cited by examiner

300

350

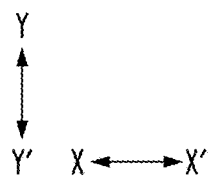
FIG. 4A
400
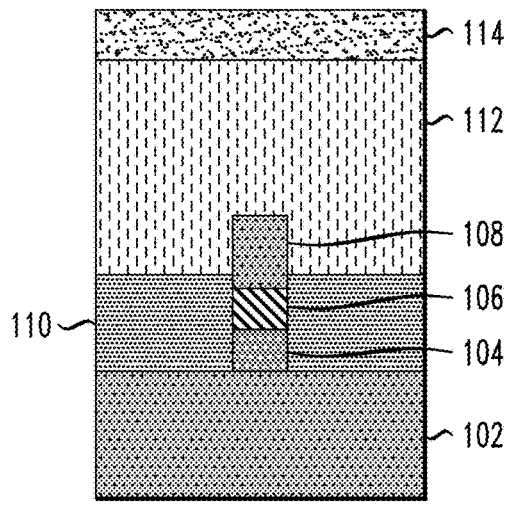
FIG. 4B
450
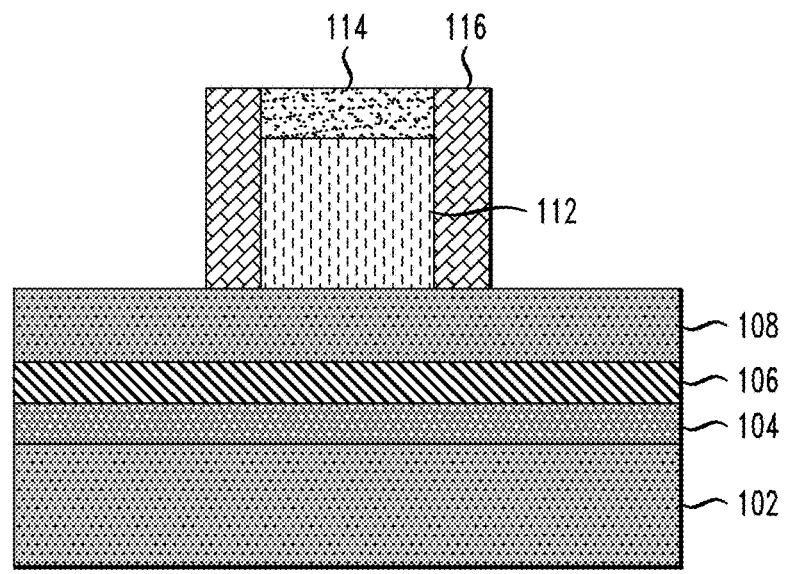

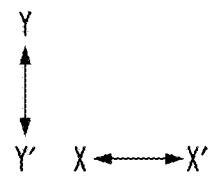
*FIG. 6A*
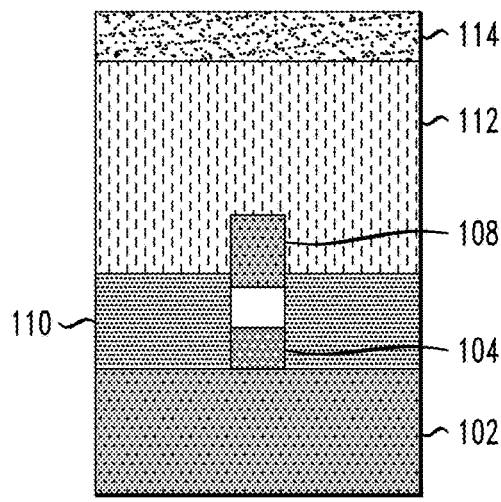
*FIG. 6B*
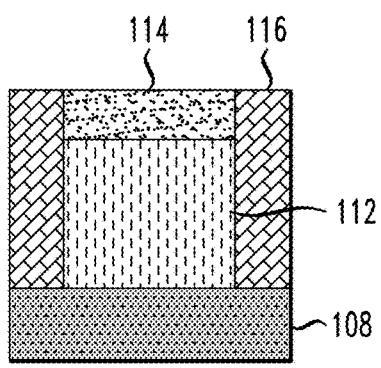
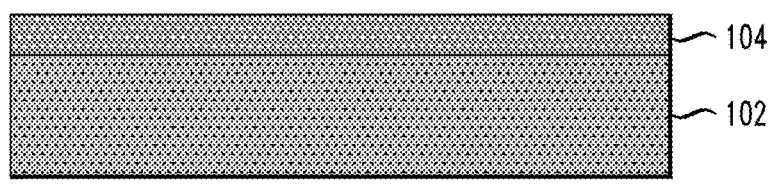

800

850

900

950

TENSILE STRAIN IN NFET CHANNEL

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming tensile strain in n-type FET (NFET) channels.

In one embodiment, a method of forming a semiconductor structure comprises forming a fin in a film stack disposed over a top surface of a substrate, the film stack comprising a first semiconductor layer, a second semiconductor layer and a channel layer. The method also comprises forming an oxide layer disposed over the top surface of the substrate surrounding the fin, the oxide layer covering sidewalls of the first semiconductor layer and the second semiconductor layer, performing a channel release to remove the second semiconductor layer, and performing an oxidation to form a non-uniform thickness of an additional oxide layer along a length of the fin, the non-uniform thickness providing a vertical compressive strain that induces lateral tensile strain in the channel layer. The channel layer comprises an NFET channel.

In another embodiment, a semiconductor structure comprises a substrate, a semiconductor layer disposed over a top surface of the substrate, an oxide layer disposed over a top surface of the semiconductor layer, and a fin channel disposed over a portion of the oxide layer. The oxide layer has a non-uniform thickness along a length of the fin channel, the non-uniform thickness providing a vertical compressive strain that induces lateral tensile strain in the fin channel. The fin channel comprises an NFET channel.

In another embodiment, an integrated circuit comprises an NFET device comprising a substrate, a semiconductor layer disposed over a top surface of the substrate, an oxide layer disposed over a top surface of the semiconductor layer, and a fin channel disposed over a portion of the oxide layer. The oxide layer has a non-uniform thickness along a length of the fin channel, the non-uniform thickness providing a vertical compressive strain that induces lateral tensile strain in the fin channel.

BRIEF DESCRIPTION OF THE DRAWINGS

FIG. 4A depicts a side cross-sectional view of the semiconductor structure shown in FIGS. 3A and 3B following dummy gate and spacer formation, according to an embodiment of the invention.

FIG. 4B depicts another side cross-sectional view of the semiconductor structure shown in FIGS. 3A and 3B following the dummy gate and spacer formation, according to an embodiment of the invention.

FIG. 6A depicts a side cross-sectional view of the semiconductor structure shown in FIGS. 5A and 5B following selective channel release, according to an embodiment of the invention.

FIG. 6B depicts another side cross-sectional view of the semiconductor structure shown in FIGS. 5A and 5B following the selective channel release, according to an embodiment of the invention.

DETAILED DESCRIPTION

Figure 1:
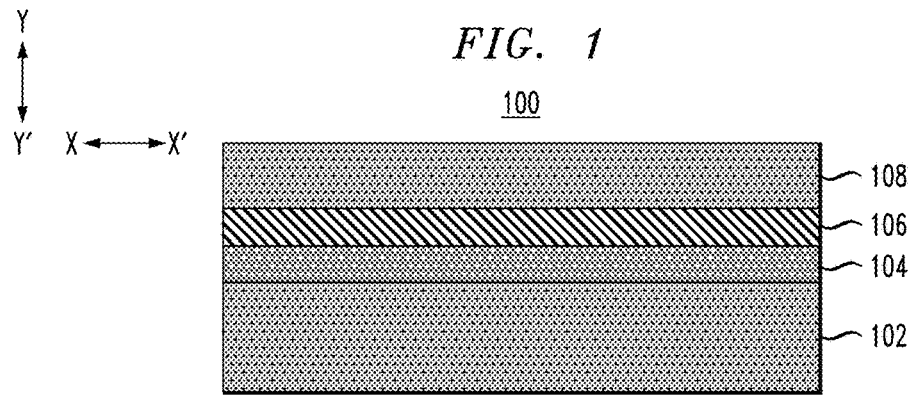
FIG. 1 depicts a side-cross sectional view of a semiconductor film stack, according to an embodiment of the invention.

Illustrative embodiments of the invention may be described herein in the context of illustrative methods for forming tensile strain in n-type field-effect transistor (NFET) channels, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of majority carriers along a channel that runs past the gate between the source and drain. Current through the channel between the source and drain may be controlled by a transverse electric field under the gate. The length of the gate determines how fast the FET switches, and can be about the same as the length of the channel (such as the distance between the source and drain).

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (NFET and PFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques. An important indicator of device performance is carrier mobility. It is difficult to keep carrier mobility high as devices continue to shrink in size.

Current carrying capability, and thus performance of a FET, may be considered proportional to the mobility of a majority carrier in the channel. The mobility of holes (e.g., the majority carriers in a PFET) and the mobility of electrons (e.g., the majority carriers in an NFET) can be enhanced by applying an appropriate stress to the channel. Stress engineering methods may be used to enhance performance, increasing device drive current without increasing device size or capacitance. Application of a tensile stress to NFETs enhances electron mobility, while application of compressive stress to PFETs enhances hole mobility.

Embodiments provide techniques for introduction of tensile strain in NFET channels. In some embodiments, the stressor is inserted below a fin channel rather than underneath an epitaxial region. Embodiments may utilize an oxidation process to introduce strain, with the channel being protected from being oxidized by a protection layer below the channel. In some embodiments, buried silicon germanium (SiGe) oxidation is used to introduce tensile strain for NFET channels, with no damage to the NFET channel and native device isolation.

As discussed above, tensile strain in NFET channels can improve device performance. High germanium (Ge) percentage (Ge %) SiGe below a silicon (Si) channel may be used to form a tensile Si channel. However, during epitaxial or metal gate high temperature anneal, the high Ge % SiGe film starts to show more defects and loses strain. Also, the SiGe below the Si channel will show more leakage. Embodiments induce tensile strain in an NFET channel through oxidation of a SiGe channel to induce tensile strain in a horizontal direction. The Si channel is on an insulator to prevent current leakage to a substrate.

Illustrative processes for forming tensile strain in NFET channels will now be described with respect to FIGS. 1-11.

FIG. 1 depicts a side cross-sectional view 100 of a semiconductor structure, comprising a substrate 102 and a film stack formed over the substrate 102. The film stack includes a first semiconductor layer 104, a second semiconductor layer 106 and a channel layer 108. The first semiconductor layer 104 and second semiconductor layer 108 are also referred to herein as semiconductor alloy layers or Group IV semiconductor alloy layers.

In some embodiments, the substrate 102 comprises a semiconductor substrate formed of silicon (Si), although other suitable materials may be used. For example, the substrate 102 can include any suitable substrate structure, e.g., a bulk semiconductor, a semiconductor-on-insulator (SOI) substrate, etc. In one example, the substrate 102 can include a silicon-containing material. Illustrative examples of Si-containing materials suitable for the substrate 102 can include, but are not limited to, Si, silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), germanium tin (GeSn), etc.

The substrate 102 may have a width and height selected as desired for a particular application, such as based on a desired number of FETs that are to be formed thereon.

The first semiconductor layer 104 and the second semiconductor layer 106 may each be formed of a semiconductor alloy. In some embodiments, the first semiconductor layer 104 and the second semiconductor layer 106 may comprise silicon germanium (SiGe), but with different Ge %. However, various other suitable materials may be used, including other Group IV semiconductor alloys such as silicon carbide (SiC), silicon germanium carbide (SiGeC), GeSn, silicon germanium tin (SiGeSn), etc. The first semiconductor layer 104 may have a height or vertical thickness (in direction Y-Y') in the range of 10 nanometers (nm) to 15 nm, although other heights above or below this range may be used as desired for a particular application. The second semiconductor layer 106 may have a height or vertical thickness (in direction Y-Y') in the range of 5 nm to 10 nm, although other heights above or below this range may be used as desired for a particular application.

In the description below, it is assumed that the first semiconductor layer 104 and the second semiconductor layer 106 are both formed of SiGe, and are referred to as a bottom SiGe layer 104 and a top SiGe layer 106. The bottom SiGe layer 104 may have a Ge % in the range of 10-20% with a thickness in the range of 10-15 nm, while the top SiGe layer 106 may have a Ge % in the range of 40-100% with a thickness in the range of 5-10 nm, although other values outside these ranges may be used as desired for a particular application. It is to be further appreciated that embodiments are not limited to use with SiGe as the material for the layers 104 and 106 as discussed above.

The channel layer 108 may comprise Si, although other suitable materials such as SiC, SiGeC, GeSn, SiGeSn, etc. may be used. The channel layer 108 may have a height or vertical thickness (in direction Y-Y') in the range of 20 nm to 60 nm, although other heights above or below this range may be used as desired for a particular application.

Figure 2A:
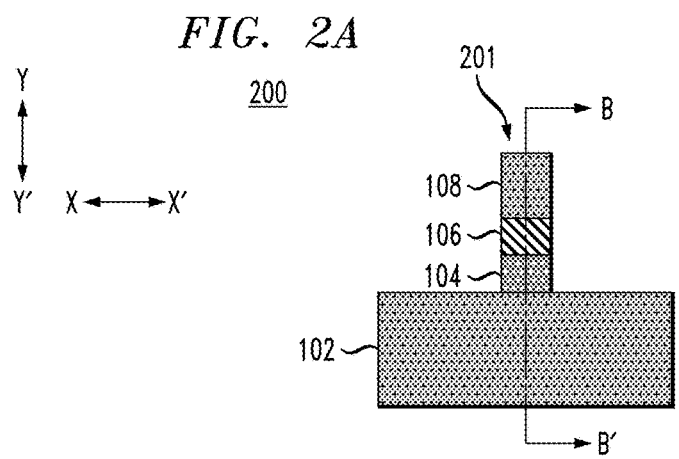
FIG. 2A depicts a side cross-sectional view of the semiconductor structure of FIG. 1 after fin formation, according to an embodiment of the invention.
Figure 2B:
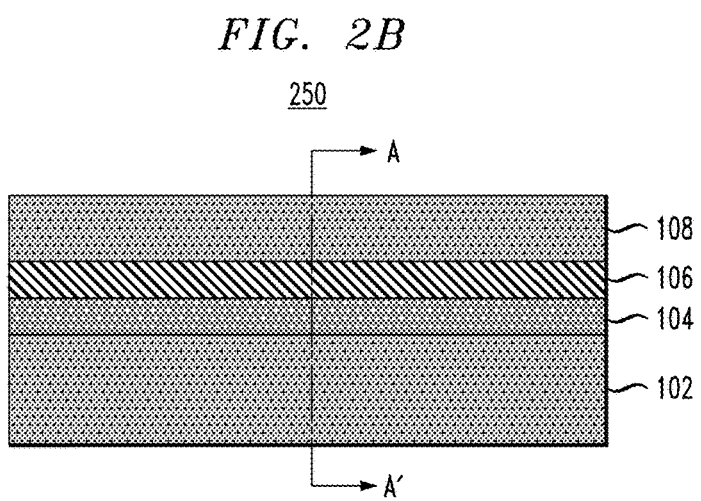
FIG. 2B depicts another side cross-sectional view of the semiconductor structure of FIG. 1 after fin formation, according to an embodiment of the invention.

FIG. 2A depicts a side cross-sectional view 200 of the semiconductor structure shown in FIG. 1 following formation of a fin 201 in the film stack disposed over the substrate 102. FIG. 2B depicts another side cross-sectional view 250 of the semiconductor structure shown in FIG. 1 following formation of the fin 201. While only one fin 201 is shown for clarity of illustration, it is to be appreciated that multiple fins may be patterned or formed from the film stack as desired, such as based on a number of transistors or other devices or structural features to be formed.

The side-cross sectional view 200 of FIG. 2A (as well as the side cross-sectional views of FIGS. 3A-11A) are each taken perpendicular to a length of the fin 201 (e.g., as a cross-section of the channel in a resulting NFET device), while the side cross-sectional view 250 of FIG. 2B (as well as the side cross-sectional views of FIGS. 3B-11B) are taken along the length of the fin 201 (e.g., along the channel in the resulting NFET device). More particularly, the side cross-sectional view 200 of FIG. 2A is taken along the line A-A in the side cross-sectional view 250 of FIG. 2B, and the side cross-sectional view 250 of FIG. 2B is taken along the line B-B in the side cross-sectional view 200 of FIG. 2A.

As shown in FIG. 2A, the fin 201 is patterned in the film stack of the bottom SiGe layer 104, the top SiGe layer 106 and channel layer 108. The fin 201 may have a width or horizontal thickness (in direction X-X' of FIG. 1A) in the range of 20 nm to 60 nm, although other widths above or below this range may be used as desired for a particular application. The fin 201 may have a length (in direction X-X' of FIG. 1B) in the range of 20 nm to 60 nm although other lengths above or below this range may be used as desired for a particular application. The fin 201 may be formed by lithography followed by etching, using sidewall image transfer (SIT) techniques, etc.

Figure 3A:
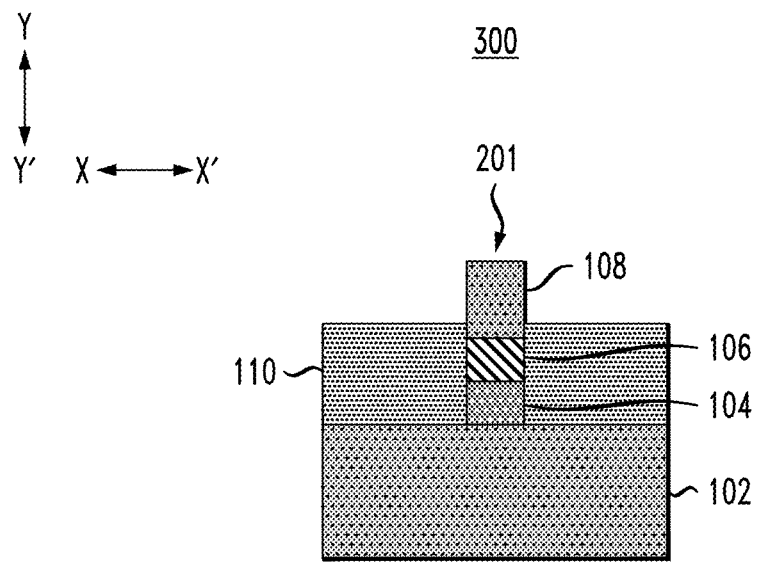
FIG. 3A depicts a side cross-sectional view of the semiconductor structure shown in FIGS. 2A and 2B following formation of an oxide, according to an embodiment of the invention.
Figure 3B:
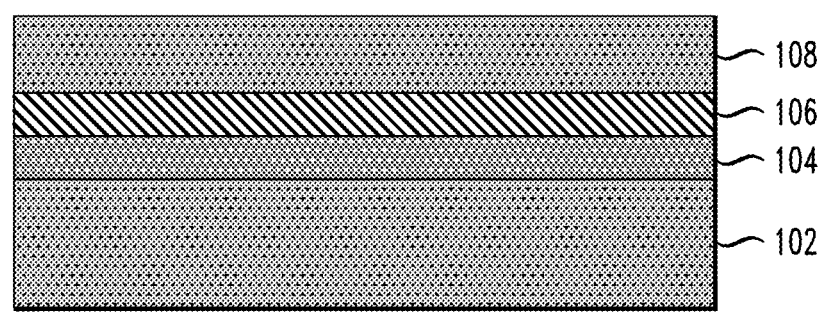
FIG. 3B depicts another side cross-sectional view of the semiconductor structure shown in FIGS. 2A and 2B following formation of the oxide, according to an embodiment of the invention.

FIG. 3A depicts a side cross-sectional view 300 of the semiconductor structure shown in FIGS. 2A and 2B following formation of an oxide 110 surrounding the fin 201 after fin reveal. FIG. 3B depicts another side cross-sectional view 350 of the semiconductor structure shown in FIGS. 2A and 2B following formation of the oxide 110. The fin reveal may be performed by a wet or dry etching that reveals a channel portion of the fin 201.

The oxide 110 may comprise any suitable oxide material. The oxide 110 may be formed using chemical vapor deposition (CVD) processing. The oxide 110 may have a height or vertical thickness (in direction Y-Y') in the range of 20 nm to 60 nm, although other heights above or below this range may be used as desired for a particular application.

FIG. 4A depicts a side cross-sectional view 400 of the semiconductor structure shown in FIGS. 3A and 3B following formation of a dummy gate 112, a capping layer 114 over a top surface of the dummy gate 112, and of spacers 116 on sidewalls of the dummy gate 112 and capping layer 114. FIG. 4B depicts another side cross-sectional view 450 of the semiconductor structure shown in FIGS. 3A and 3B following formation of dummy gate 112, capping layer 114 and spacers 116.

The dummy gate 112 may be formed of amorphous silicon (a-Si), although other suitable materials such as polysilicon (poly-Si) may be used. The dummy gate 112 may be formed by CVD and reactive-ion etching (ME) processing. The dummy gate 112 may have a width or horizontal thickness (in direction X-X' of FIG. 3A) in the range of 5 nm to 500 nm although other widths above or below this range may be used as desired for a particular application. The dummy gate 112 may have a width or horizontal thickness (in direction X-X' of FIG. 3B) in the range of 5 nm to 500 nm although other widths above or below this range may be used as desired for a particular application. The dummy gate 112 may have a height or vertical thickness (in direction Y-Y') in the range of 40 nm to 250 nm although other heights above or below this range may be used as desired for a particular application.

The capping layer 114 may be formed of silicon nitride (SiN), although other suitable materials such as oxide materials may be used. The capping layer 114 may be formed using CVD, atomic layer deposition (ALD) or other suitable processing. The capping layer 114 may have a height or vertical thickness (in direction Y-Y') in the range of 10 nm to 80 nm although other heights above or below this range may be used as desired for a particular application.

The spacers 116 may be formed of silicon boron carbide nitride (SiBCN), although other suitable materials such as SiN, silicon carbide oxide (SiCO), silicon oxycarbonitride (SiOCN), etc. may be used. The spacers may be formed using ALD, CVD or other suitable processing. The spacers 116 may have a height that matches a top surface of the capping layer 114, and may have a width or horizontal thickness (in direction X-X' of FIG. 3B) in the range of 4 nm to 20 nm although other widths above or below this range may be used as desired for a particular application.

Figure 5A:
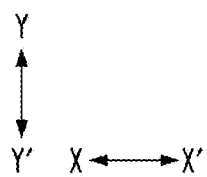
FIG. 5A depicts a side cross-sectional view of the semiconductor structure shown in FIGS. 4A and 4B following recess of the channel layer, according to an embodiment of the invention.
Figure 5A:
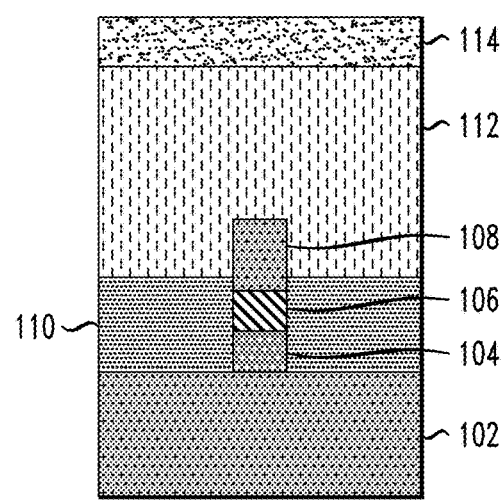
Figure 5B:
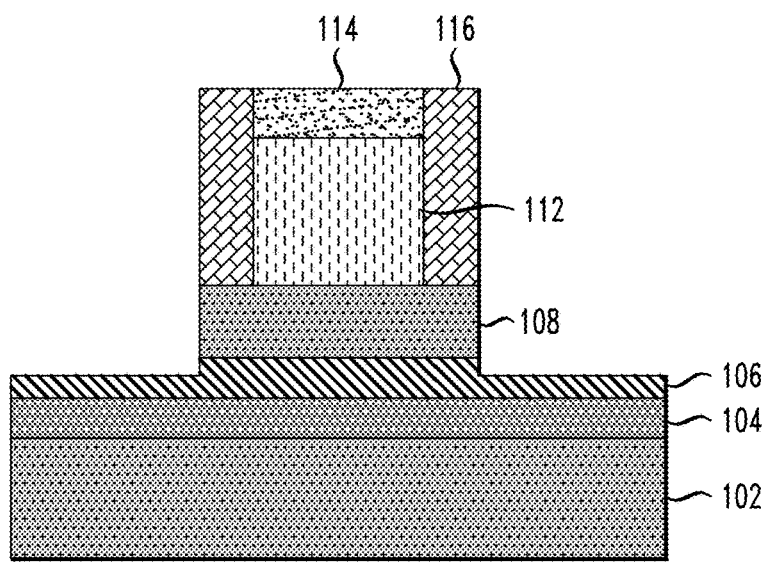
FIG. 5B depicts another side cross-sectional view of the semiconductor structure shown in FIGS. 4A and 4B following the recess of the channel layer, according to an embodiment of the invention.

FIG. 5A depicts a side cross-sectional view 500 of the semiconductor structure shown in FIGS. 4A and 4B following recess of the channel layer 108. FIG. 5B depicts another side cross-sectional view 550 of the semiconductor structure shown in FIGS. 4A and 4B following recess of the channel layer 108. The channel layer 108 that is exposed by the capping layer 114 and spacers 116 is recessed using RIE or other suitable processing. As shown in FIG. 5B, the recess of channel layer 108 continues into the top SiGe layer 106, so as to expose a portion of the top SiGe layer 106. The top SiGe layer 106 may be recessed to a depth in the range of 5 nm to 10 nm, although other depths above or below this range may be used as desired for a particular application.

FIG. 6A depicts a side cross-sectional view 600 of the semiconductor structure shown in FIGS. 5A and 5B following a selective channel release, so as to release the top SiGe layer 106. FIG. 6B depicts another side cross-sectional view 650 of the semiconductor structure shown in FIGS. 5A and 5B following the selective channel release. The selective channel release, as illustrated, removes the remaining portion of the top SiGe layer 106. The selective channel release uses a selective etching, which removes the top SiGe layer 106 selective to the material of channel layer 108, and also selective to the bottom SiGe layer 104. If the channel layer 108 is formed of Si, the selective etching may use hydrochloric acid (HCl) and SC1 ammonium hydroxide ($NH_4OH$): hydrogen peroxide ($H_2O_2$).

Figure 7A:
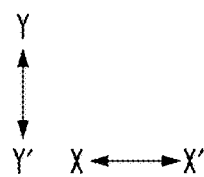
FIG. 7A depicts a side cross-sectional view of the semiconductor structure shown in FIGS. 6A and 6B following formation of a liner and spacers, according to an embodiment of the invention.
Figure 7A:
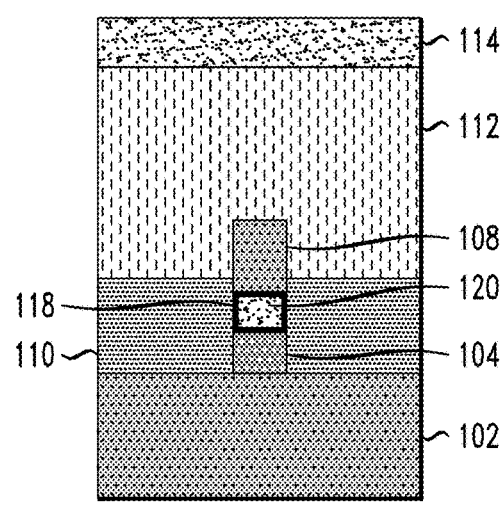
Figure 7B:
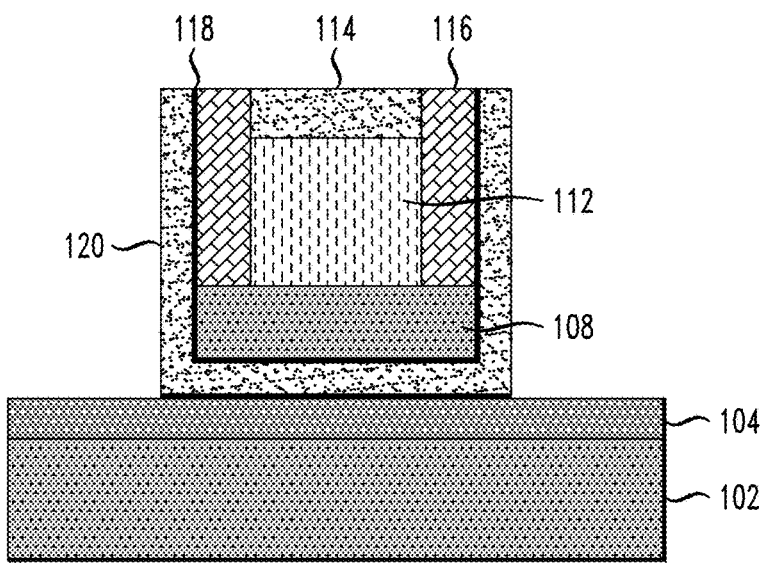
FIG. 7B depicts another side cross-sectional view of the semiconductor structure shown in FIGS. 6A and 6B following formation of the liner and spacers, according to an embodiment of the invention.

FIG. 7A depicts a side cross-sectional view 700 of the semiconductor structure shown in FIGS. 6A and 6B following formation of a liner 118 and spacer 120. FIG. 7B depicts another side cross-sectional view 750 of the semiconductor structure shown in FIGS. 6A and 6B following formation of the liner 118 and spacer 120.

The liner 118 may be formed of silicon oxynitride (SiON), although other suitable materials such as SiCO and silicon carbon oxynitride (SiCON), etc. may be used. The liner 118 may be formed using a conformal deposition process such as CVD or ALD. The liner 118 may be ultra-thin, such as with a uniform thickness in the range of 1 nm to 3 nm although other thicknesses above or below this range may be used as desired for a particular application. The liner 118 separates the channel material 108 from the spacer 120.

The spacer 120, also referred to as an isolation or protection layer, may be formed of SiN, although other suitable materials such as SiBCN, silicon carbonitride (SiCN), SiCO, etc. may be used. The spacer 120 pinches off in the trench below the fin channel 108, and also forms an additional spacer to protect the fin channel 108 during ME.

Figure 8A:
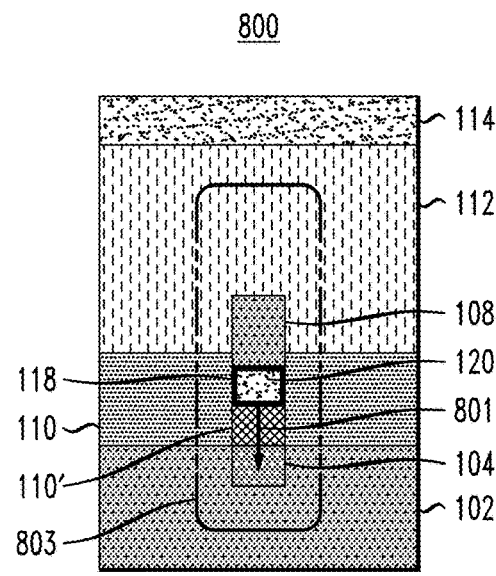
FIG. 8A depicts a side cross-sectional view of the semiconductor structure shown in FIGS. 7A and 7B following oxidation, according to an embodiment of the invention.
Figure 8B:
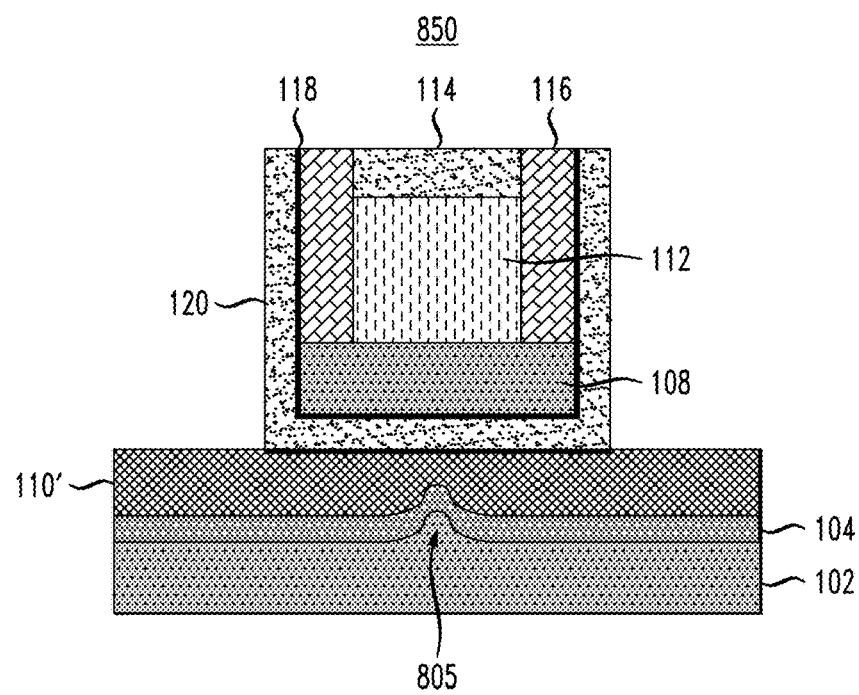
FIG. 8B depicts another side cross-sectional view of the semiconductor structure shown in FIGS. 7A and 7B following oxidation, according to an embodiment of the invention.

FIG. 8A depicts a side cross-sectional view 800 of the semiconductor structure shown in FIGS. 7A and 7B following oxidation. FIG. 8B depicts another side cross-sectional view 850 of the semiconductor structure shown in FIGS. 8A and 8B following oxidation.

As shown in FIGS. 8A and 8B, the oxidation results in formation of oxide 110' in regions below the fin 201. During oxidation, silicon in the bottom SiGe layer 104 reacts and forms the oxide 110' (e.g., SiO). The germanium in the bottom SiGe layer 104 condensates downwards towards the substrate 102. Portions of the silicon in the substrate 102 may also react to form portions of the oxide 110', as indicated by the reduced thickness of the substrate 102 in FIG. 8B as compared with FIG. 7B. The reduced thickness of the substrate 102 will depend on the length of the oxidation process, but may be in the range of 5 nm to 20 nm thickness loss, although other thickness loss outside this range may be used as desired for a particular application. The "bump" feature 805 is formed, as the oxidation takes longer to react below the fin channel 108 as there is less room (compared to areas on either side of the fin channel 108). In other words, the oxidation starts outside the fin channel 108 and works its way inward. By stopping the oxidation at an appropriate time, the bump feature 805 is provided such that there is non-uniform thickness of the oxide 110' below the fin channel 108. The fin 201 is anchored in the gate region as illustrated by elements 801 and 803. The bump feature 805 causes compressive strain in the vertical direction (e.g., in direction Y-Y'), which induces tensile stress along the fin 201 (e.g., along the fin channel 108).

In some embodiments, the oxidation of the top SiGe layer 106 and the bottom SiGe layer 104 is a low temperature oxidation, such as a thermal oxidation with a temperature in the range of 600 degrees Celsius (° C.) to 800° C. for a duration in the range of 1000 seconds (s) to 3000 s. In some embodiments, the low temperature oxidation of SiGe provides a shear stress of ~1e10 dynes per centimeter squared (dyn/cm$^2$), thus achieving ~1% strain along the channel 108 due to oxidation. An amount of tensile strain that is induced may be measured, using, for example, nano-beam diffraction (NBD) for measuring stress distribution.

Figure 9A:
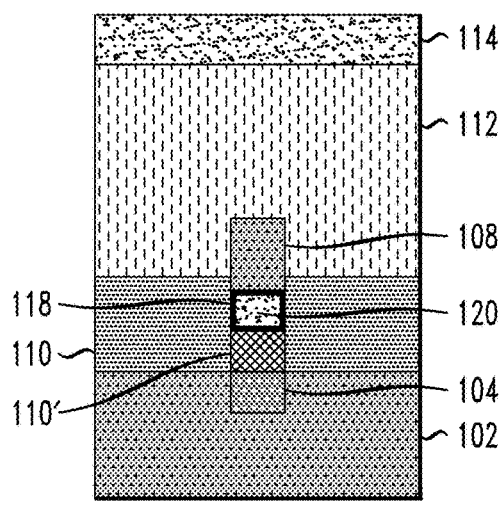
FIG. 9A depicts a side cross-sectional view of the semiconductor structure shown in FIGS. 8A and 8B following an etching to expose the fin channel, according to an embodiment of the invention.
Figure 9B:
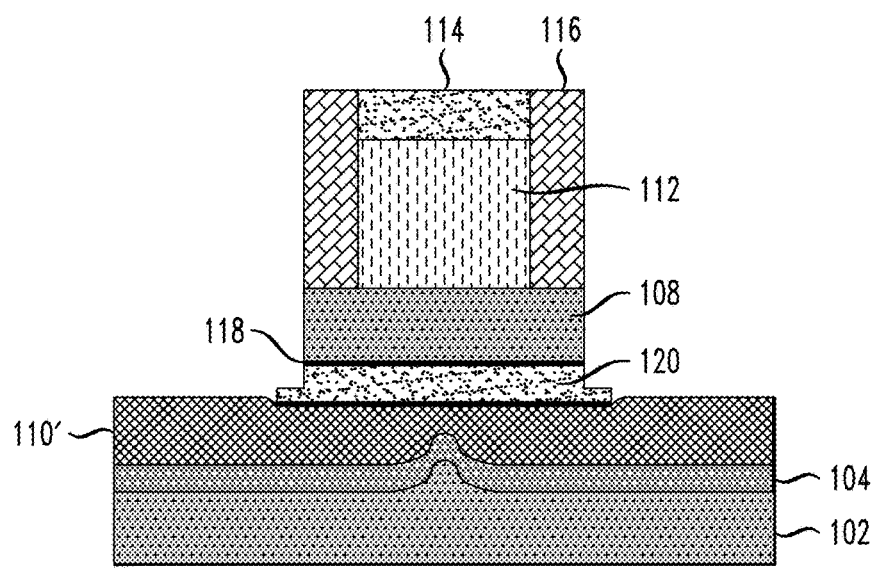
FIG. 9B depicts another side cross-sectional view of the semiconductor structure shown in FIGS. 8A and 8B following the etching to expose the fin channel, according to an embodiment of the invention.

FIG. 9A depicts a side cross-sectional view 900 of the semiconductor structure shown in FIGS. 8A and 8B following an etching to expose the fin channel 108. FIG. 9B depicts another side cross-sectional view 950 of the semiconductor structure shown in FIGS. 8A and 8B following the etching to expose the fin channel 108. The etching may comprise an isotropic etch of portions of the liner 118 and the spacer 120 to expose the sides of the channel layer 108 as illustrated in FIG. 9B. In some embodiments, the etching continues until the liner 118 on sidewalls of the channel 108 are completely removed, and until the spacer 120 has a top surface (surrounding the fin 201) that is substantially coplanar with a top surface of the oxide 110'. In some embodiments, the spacer etch continues until spacer materials on sidewalls of the channel layer 108 are completely removed, but need not continue until the remaining portion of the spacer 120 has a top surface substantially coplanar with oxide 110'.

Figure 10A:
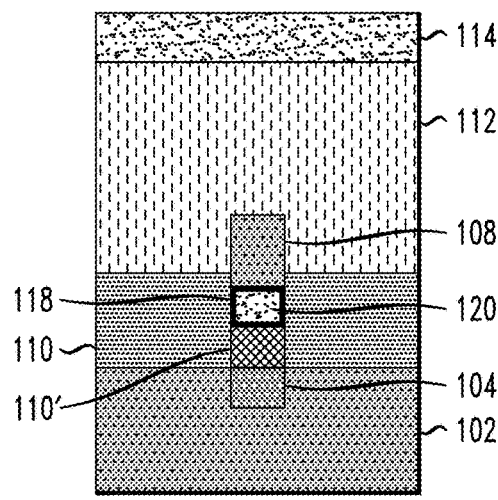
FIG. 10A depicts a side cross-sectional view of the semiconductor structure shown in FIGS. 9A and 9B following epitaxial growth and oxide fill, according to an embodiment of the invention.
Figure 10B:
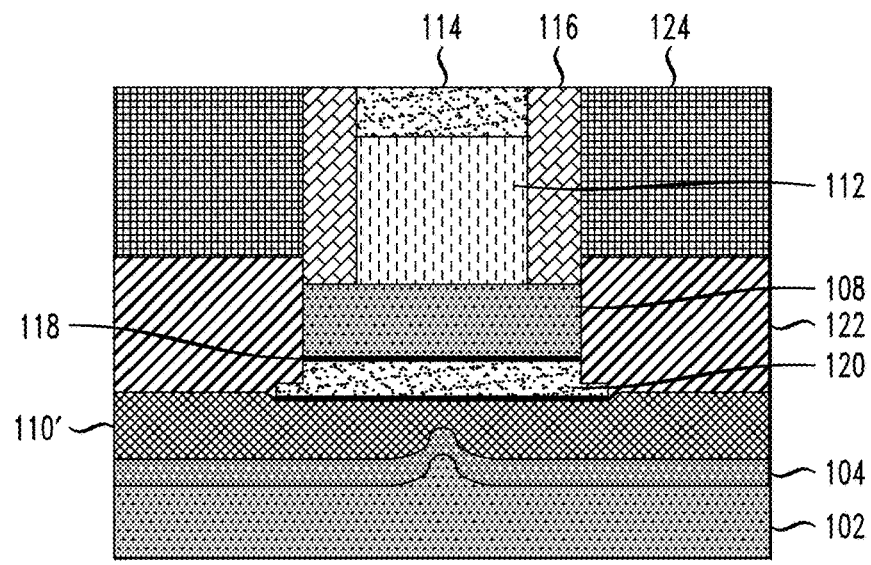
FIG. 10B depicts another side cross-sectional view of the semiconductor structure shown in FIGS. 9A and 9B following the epitaxial growth and oxide fill, according to an embodiment of the invention.

FIG. 10A depicts a side cross-sectional view 1000 of the semiconductor structure shown in FIGS. 9A and 9B following epitaxial growth and oxide fill. FIG. 10B depicts another side cross-sectional view 1050 of the semiconductor structure shown in FIGS. 9A and 9B following the epitaxial growth and oxide fill. As illustrated in FIG. 10B, source/drain regions 122 are epitaxially grown above the oxide 110' on exposed sidewalls of the channel layer 108. The source/drain regions 122 may be formed of doped silicon, such as silicon doped with phosphorus (Si:P) or silicon doped with arsenic (Si:As), although other suitable materials may be used. Additional oxide 124 is filled over the source/drain regions 122.

The oxide 124 may be formed using CVD or other suitable processing. After fill, the oxide 124 may be planarized with a top surface of the capping layer 114 using, for example, chemical mechanical polishing or planarization (CMP).

Figure 11A:
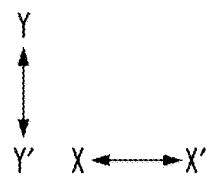
FIG. 11A depicts a side cross-sectional view of the semiconductor structure shown in FIGS. 10A and 10B following gate formation, according to an embodiment of the invention.
Figure 11A:
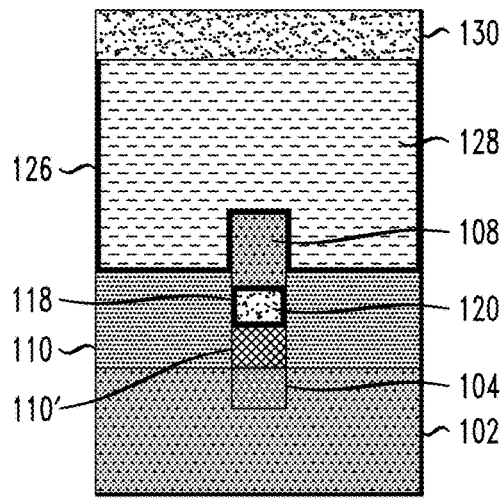
Figure 11B:
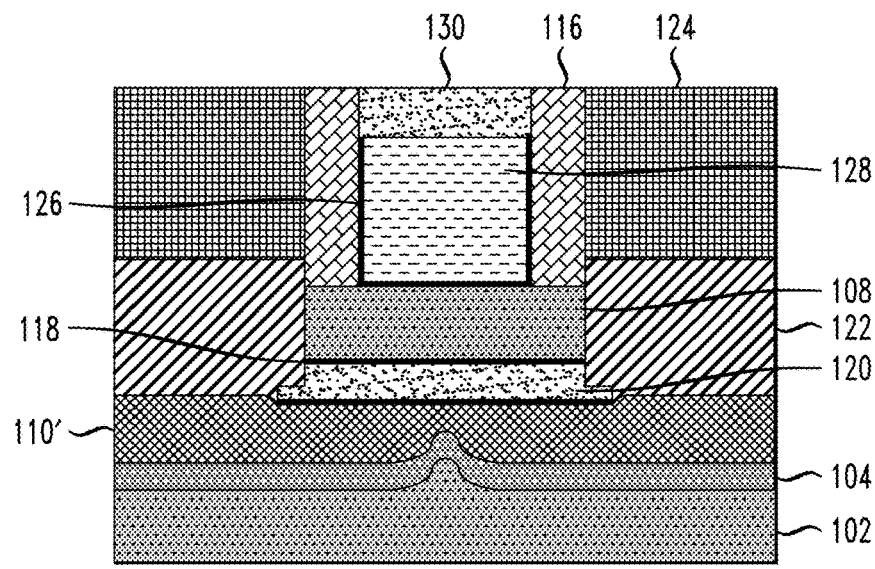
FIG. 11B depicts another side cross-sectional view of the semiconductor structure shown in FIGS. 10A and 10B following gate formation, according to an embodiment of the invention.

FIG. 11A depicts a side cross-sectional view 1100 of the semiconductor structure shown in FIGS. 10A and 10B following gate formation. FIG. 11B depicts another side cross-sectional view 1150 of the semiconductor structure shown in FIGS. 10A and 10B following gate formation. Gate formation may include removal of the capping layer 114 using wet etching or other suitable processing, followed by removal of the dummy gate 112 using a dry etching plus wet etching or other suitable processing. A gate dielectric 126 and gate conductor 128 are then formed.

The gate dielectric 126 is then formed over the exposed top surface of the channel layer 108, and on exposed sidewalls of spacers 116. The gate dielectric 126 may be formed of a high-k dielectric material, although other suitable materials may be used. Examples of high-k materials include but are not limited to metal oxides such as hafnium oxide ($HfO_2$), hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k may further include dopants such as lanthanum (La), aluminum (Al), and magnesium (Mg). The gate dielectric 126 may be formed using ALD or CVD processing, although other suitable processes may be used. The gate dielectric 126 has a uniform thickness in the range of 10 angstroms (Å) to 40 Å, although other thicknesses above or below this range may be used as desired for a particular application.

The gate conductor 128 is formed over the gate dielectric 126. The gate conductor 128 may be formed of any suitable conducting material, including but not limited to, doped polycrystalline or amorphous silicon, germanium (Ge), silicon germanium (SiGe), a metal (e.g., tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), gold (Au), etc.), a conducting metallic compound material (e.g., tantalum nitride (TaN), titanium nitride (TiN), tantalum carbide (TaC$_X$), titanium carbide (TiC), titanium aluminum carbide, tungsten silicide (WSi$_2$), tungsten nitride (WN), ruthenium oxide (RuO$_2$), cobalt silicide, nickel silicide, etc.), carbon nanotubes, conductive carbon, graphene, or any suitable combination of these and other suitable materials. The conductive material may further comprise dopants that are incorporated during or after deposition. In some embodiments, the gate conductor includes a work function metal (WFM) layer to set the threshold voltage of the nanosheet transistor to a desired value. The WFM may be: a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC); and combinations thereof. The gate conductor 128 has a height or vertical thickness (in direction Y-Y'), measured from a top surface of channel layer 108, in the range of 20 nm to 100 nm, although other heights above or below this range may be used as desired for a particular application.

A self-aligned contact (SAC) capping layer 130 is formed over a top surface of the gate dielectric 126 and gate conductor 128. The SAC capping layer 130 may be formed of SiN, although other suitable materials such as SiCN, SiON, etc. may be used. The SAC capping layer 130 may have a height or vertical thickness (in direction Y-Y') in the range of 10 nm to 50 nm, although other heights above or below this range may be used as desired for a particular application.

In some embodiments, the low temperature oxidation of films (e.g., top SiGe layer 106 and bottom SiGe layer 104) under the channel 108 induces a compressive strain along the fin 201 vertical direction. The compressive strain in the vertical direction achieves a tensile strain along the fin channel 108. The resulting NFET thus has a unique structure, with an oxide layer below the fin channel 108 being non-uniform along the fin direction.

In some embodiments, a method of forming a semiconductor structure comprises forming a fin in a film stack disposed over a top surface of a substrate, the film stack comprising a first semiconductor layer, a second semiconductor layer and a channel layer. The method also comprises forming an oxide layer disposed over the top surface of the substrate surrounding the fin, the oxide layer covering sidewalls of the first semiconductor layer and the second semiconductor layer, performing a channel release to remove the second semiconductor layer, and performing an oxidation to form a non-uniform thickness of an additional oxide layer along a length of the fin, the non-uniform thickness providing a vertical compressive strain that induces lateral tensile strain in the channel layer. The channel layer comprises an n-type field-effect transistor (NFET) channel.

The first semiconductor layer may comprise SiGe with a first Ge %, the second semiconductor layer may comprise SiGe with a second Ge % greater than the first Ge %, and the channel layer may comprise Si.

In some embodiments, the oxidation comprises a low-temperature oxidation. The oxidation may form the non-uniform thickness of the additional oxide layer along the length of the fin such that an inner portion of the oxide layer disposed below a center of the channel layer of the fin having a smaller thickness than outer portions of the additional oxide layer proximate ends of the fin.

In some embodiments, forming the oxide layer comprises forming an oxide disposed over the top surface of the substrate surrounding the at least one fin, forming a dummy gate disposed over a top surface of a portion of the channel layer and over portions of the oxide surrounding the portion of the channel layer, forming a capping layer over a top surface of the dummy gate, and forming a spacer on sidewalls of the dummy gate and the capping layer. The dummy gate may comprise a-Si, the capping layer may comprise SiN, and the spacer may comprise SiBCN.

The method may further comprise recessing the channel layer and a portion of the second semiconductor layer exposed by the spacer and performing the channel release to remove remaining portions of the second semiconductor layer. The method may further comprise forming a liner on exposed surfaces of the channel layer, the first semiconductor layer, and the spacer, and forming a nitride layer: disposed between (i) the bottom surface of the liner disposed on a bottom surface of the channel layer and (ii) a top surface of the liner disposed on a top surface of the first semiconductor layer; and on sidewalls of the liner disposed on sidewalls of the spacer. The liner may comprise SiON and the nitride layer may comprise SiN.

In some embodiments, the method further comprises etching portions of the liner and the nitride layer to expose sidewalls of the channel layer. The method may further comprise forming source/drain regions over a top surface of the oxide adjacent exposed sidewalls of the channel layer, and forming an oxide disposed over top surfaces of the source/drain regions. Forming the oxide may comprise filling with the oxide and planarizing a top surface of the oxide with a top surface of the capping layer using CMP. The method may further comprise removing the dummy gate and the capping layer, forming a gate dielectric on a top surface of the channel layer and on a portion of exposed sidewalls of the spacers, forming a gate conductor disposed over the gate dielectric, and forming a SAC capping layer disposed over top surfaces of the gate dielectric and the gate conductor between exposed sidewalls of the spacer. The gate dielectric may comprise a high-k dielectric material, the gate conductor may comprise a metal, and the SAC capping layer may comprise SiN.

In another embodiment, a semiconductor structure comprises a substrate, a semiconductor layer disposed over a top surface of the substrate, an oxide layer disposed over a top surface of the semiconductor layer, and a fin channel disposed over a portion of the oxide layer. The oxide layer has a non-uniform thickness along a length of the fin channel, the non-uniform thickness providing a vertical compressive strain that induces lateral tensile strain in the fin channel. The fin channel comprises an NFET channel.

The semiconductor structure may further comprise a liner disposed on a bottom surface of the fin channel and on a top surface of the oxide layer below the fin channel, a nitride layer disposed between: (i) a bottom surface of the liner disposed on the bottom surface of the fin channel; and (ii) a top surface the liner disposed on the top surface of the oxide layer, a spacer disposed on outer portions of a top surface of the fin channel, source/drain regions disposed on a top surface of the oxide layer surrounding the liner, the nitride layer, the fin channel and at least a portion of outer sidewalls of the spacer, and an additional oxide layer disposed over top surfaces of the source/drain regions surrounding the outer sidewalls of the spacer. The semiconductor structure may further comprise a gate dielectric disposed over inner portions of the top surface of the fin channel and a portion of interior sidewalls of the spacer, a gate conductor disposed over the gate dielectric, and a SAC capping layer disposed over the gate dielectric and the gate conductor.

In another embodiment, an integrated circuit comprises an NFET device comprising a substrate, a semiconductor layer disposed over a top surface of the substrate, an oxide layer disposed over a top surface of the semiconductor layer, and a fin channel disposed over a portion of the oxide layer. The oxide layer has a non-uniform thickness along a length of the fin channel, the non-uniform thickness providing a vertical compressive strain that induces lateral tensile strain in the fin channel.

The NFET device may further comprise a liner disposed on a bottom surface of the fin channel and on a top surface of the oxide layer below the fin channel, a nitride layer disposed between: (i) a bottom surface of the liner disposed on the bottom surface of the fin channel; and (ii) a top surface the liner disposed on the top surface of the oxide layer, a spacer disposed on outer portions of a top surface of the fin channel, source/drain regions disposed on a top surface of the oxide layer surrounding the liner, the nitride layer, the fin channel and at least a portion of outer sidewalls of the spacer, and an additional oxide layer disposed over top surfaces of the source/drain regions surrounding the outer sidewalls of the spacer. The NFET device may further comprise a gate dielectric disposed over inner portions of the top surface of the fin channel and a portion of interior sidewalls of the spacer, a gate conductor disposed over the gate dielectric, and a SAC capping layer disposed over the gate dielectric and the gate conductor.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors an sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
    forming a fin in a film stack disposed over a top surface of a substrate, the film stack comprising a first semiconductor layer, a second semiconductor layer and a channel layer;
    forming an oxide layer disposed over the top surface of the substrate surrounding the fin, the oxide layer covering sidewalls of the first semiconductor layer and the second semiconductor layer;
    performing a channel release to remove the second semiconductor layer; and
    performing an oxidation to form a non-uniform thickness of an additional oxide layer along a length of the fin, the non-uniform thickness providing a vertical compressive strain that induces lateral tensile strain in the channel layer;
    wherein the channel layer comprises an n-type field-effect transistor (NFET) channel; and
    wherein the first semiconductor layer comprises silicon germanium (SiGe) with a first percentage of germanium (Ge), the second semiconductor layer comprises SiGe with a second percentage of Ge higher than the first percentage, and the channel layer comprises silicon (Si).

2. The method of claim 1, wherein the oxidation comprises a low-temperature oxidation.

3. A method of forming a semiconductor structure, comprising:
    forming a fin in a film stack disposed over a top surface of a substrate, the film stack comprising a first semiconductor layer, a second semiconductor layer and a channel layer;
    forming an oxide layer disposed over the top surface of the substrate surrounding the fin, the oxide layer covering sidewalls of the first semiconductor layer and the second semiconductor layer;
    performing a channel release to remove the second semiconductor layer; and
    performing an oxidation to form a non-uniform thickness of an additional oxide layer along a length of the fin, the non-uniform thickness providing a vertical compressive strain that induces lateral tensile strain in the channel layer;
    wherein the channel layer comprises an n-type field-effect transistor (NFET) channel; and
    wherein the non-uniform thickness of the additional oxide layer along the length of the fin comprises an inner portion of the oxide layer disposed below a center of the channel layer of the fin having a smaller thickness than outer portions of the additional oxide layer proximate ends of the fin.

4. A method of forming a semiconductor structure, comprising:
   forming a fin in a film stack disposed over a top surface of a substrate, the film stack comprising a first semiconductor layer, a second semiconductor layer and a channel layer;
   forming an oxide layer disposed over the top surface of the substrate surrounding the fin, the oxide layer covering sidewalls of the first semiconductor layer and the second semiconductor layer;
   performing a channel release to remove the second semiconductor layer; and
   performing an oxidation to form a non-uniform thickness of an additional oxide layer along a length of the fin, the non-uniform thickness providing a vertical compressive strain that induces lateral tensile strain in the channel layer;
   wherein the channel layer comprises an n-type field-effect transistor (NFET) channel; and
   wherein forming the oxide layer comprises:
      forming an oxide disposed over the top surface of the substrate surrounding the at least one fin;
      forming a dummy gate disposed over a top surface of a portion of the channel layer and over portions of the oxide surrounding the portion of the channel layer;
      forming a capping layer over a top surface of the dummy gate; and
      forming a spacer on sidewalls of the dummy gate and the capping layer.

5. The method of claim 4, wherein the dummy gate comprises amorphous silicon (a-Si), the capping layer comprises silicon nitride (SiN), and the spacer comprises silicon boron carbide nitride (SiBCN).

6. The method of claim 4, further comprising:
   recessing the channel layer and a portion of the second semiconductor layer exposed by the spacer; and
   performing the channel release to remove remaining portions of the second semiconductor layer.

7. The method of claim 6, further comprising:
   forming a liner on exposed surfaces of the channel layer, the first semiconductor layer, and the spacer; and
   forming a nitride layer:
   disposed between (i) the bottom surface of the liner disposed on a bottom surface of the channel layer and (ii) a top surface of the liner disposed on a top surface of the first semiconductor layer; and
   on sidewalls of the liner disposed on sidewalls of the spacer.

8. The method of claim 7, wherein the liner comprises silicon oxynitride (SiON) and the nitride layer comprises silicon nitride (SiN).

9. The method of claim 7, further comprising etching portions of the liner and the nitride layer to expose sidewalls of the channel layer.

10. The method of claim 9, further comprising:
    forming source/drain regions over a top surface of the oxide layer adjacent exposed sidewalls of the channel layer; and
    forming another additional oxide layer disposed over top surfaces of the source/drain regions.

11. The method of claim 10, wherein forming the other additional oxide layer comprises filling with an oxide and planarizing a top surface of the oxide with a top surface of the capping layer using chemical mechanical polishing (CMP).

12. The method of claim 10, further comprising:
    removing the dummy gate and the capping layer;
    forming a gate dielectric on a top surface of the channel layer and on a portion of exposed sidewalls of the spacers;
    forming a gate conductor disposed over the gate dielectric; and
    forming a self-aligned contact (SAC) capping layer disposed over top surfaces of the gate dielectric and the gate conductor between exposed sidewalls of the spacer.

13. The method of claim 1, wherein the gate dielectric comprises a high-k dielectric material, the gate conductor comprises a metal, and the SAC capping layer comprises silicon nitride (SiN).

14. The method of claim 1, wherein the non-uniform thickness of the additional oxide layer along the length of the fin comprises an inner portion of the oxide layer disposed below a center of the channel layer of the fin having a smaller thickness than outer portions of the additional oxide layer proximate ends of the fin.

15. The method of claim 1, wherein forming the oxide layer comprises:
    forming an oxide disposed over the top surface of the substrate surrounding the at least one fin;
    forming a dummy gate disposed over a top surface of a portion of the channel layer and over portions of the oxide surrounding the portion of the channel layer;
    forming a capping layer over a top surface of the dummy gate; and
    forming a spacer on sidewalls of the dummy gate and the capping layer.

16. The method of claim 3, wherein the first semiconductor layer comprises silicon germanium (SiGe) with a first percentage of germanium (Ge), the second semiconductor layer comprises SiGe with a second percentage of Ge higher than the first percentage, and the channel layer comprises silicon (Si).

17. The method of claim 3, wherein forming the oxide layer comprises:
    forming an oxide disposed over the top surface of the substrate surrounding the at least one fin;
    forming a dummy gate disposed over a top surface of a portion of the channel layer and over portions of the oxide surrounding the portion of the channel layer;
    forming a capping layer over a top surface of the dummy gate; and
    forming a spacer on sidewalls of the dummy gate and the capping layer.

18. The method of claim 4, wherein the first semiconductor layer comprises silicon germanium (SiGe) with a first percentage of germanium (Ge), the second semiconductor layer comprises SiGe with a second percentage of Ge higher than the first percentage, and the channel layer comprises silicon (Si).

* * * * *